United States Patent [19]
Shiraishi

[11] Patent Number: 5,481,332
[45] Date of Patent: Jan. 2, 1996

[54] PROJECTION EXPOSURE METHOD AND APPARATUS FOR IMPROVED IMAGE TRANSFER FROM PHOTOMASK HAVING PERIODIC AND NON-PERIODIC PATTERNS

[75] Inventor: Naomasa Shiraishi, Kawasaki, Japan

[73] Assignee: Nikon Corporation, Tokyo, Japan

[21] Appl. No.: 366,388

[22] Filed: Dec. 29, 1994

Related U.S. Application Data

[63] Continuation of Ser. No. 208,041, Mar. 9, 1984, abandoned, which is a continuation of Ser. No. 24,300, Mar. 1, 1993, abandoned.

[30] Foreign Application Priority Data

Mar. 6, 1992 [JP] Japan .................. 4-049440

[51] Int. Cl.[6] .................. G03B 27/42
[52] U.S. Cl. .................. 355/53; 355/55
[58] Field of Search .................. 355/53, 55; 356/401

[56] References Cited

U.S. PATENT DOCUMENTS

| | | | |
|---|---|---|---|
| 4,063,812 | 12/1977 | Abraham et al. | 355/18 |
| 4,506,977 | 3/1985 | Sato et al. | 355/53 |
| 4,705,940 | 11/1987 | Kohno | 250/201 |
| 4,748,478 | 5/1988 | Suwa et al. | 355/53 |
| 4,999,669 | 3/1991 | Sakamoto et al. | 355/53 |
| 5,045,417 | 9/1991 | Okamoto | 430/5 |
| 5,264,898 | 11/1993 | Kamon et al. | 355/53 X |
| 5,305,054 | 4/1994 | Suzuki et al. | 355/53 |
| 5,381,210 | 1/1995 | Hagiwara | 355/53 |
| 5,386,269 | 1/1995 | Kosugi | 355/43 |
| 5,408,083 | 4/1995 | Hirukawa et al. | 250/201.2 |
| 5,416,562 | 5/1995 | Ota et al. | 355/53 |

FOREIGN PATENT DOCUMENTS 6250811 4/1982 Japan.

OTHER PUBLICATIONS

Extended Abstracts (The 52nd Autumn Meeting, 1991); The Japan Society of Applied Physics, pp. 600–603.

*Primary Examiner*—Richard A. Wintercorn
*Attorney, Agent, or Firm*—Shapiro and Shapiro

[57] ABSTRACT

On the pupil plane of the projection optical system, a light shield member, having apertures separated from the optical axis, is provided. Light beams from the apertures illuminate a photomask from oblique directions, and are projected on a photosensitive substrate through a projection optical system. When the photomask bears a periodic pattern and a non-periodic pattern, the oblique illumination provides a larger depth of focus in the projected image of the periodic pattern than in the projected image of the non-periodic pattern. A partial area, in which the non-periodic pattern is projected, of the photosensitive substrate is matched with the best focal plane of the projection optical system, whereby satisfactory image transfer is realized over the entire area of the photomask.

58 Claims, 4 Drawing Sheets

PROJECTION EXPOSURE METHOD AND APPARATUS FOR IMPROVED IMAGE TRANSFER FROM PHOTOMASK HAVING PERIODIC AND NON-PERIODIC PATTERNS

This is a continuation of application Ser. No. 08/208,041 filed Mar. 9, 1994, which is a continuation of application Ser. No. 08/024,300 filed Mar. 1, 1993, both abandoned.

BACKGROUND OF THE INVENTION

1. Field of the Invention

The present invention relates to a method of projection exposure of a circuit pattern onto a photosensitive substrate and an apparatus therefor.

2. Related Background Art

A projection exposure apparatus, for example a stepper, employed in a so-called photolithographic step in the manufacturing process of semiconductor devices, projects and focuses the image of a circuit pattern formed on a reticle (or a photomask) onto a photosensitive substrate (wafer) through a projection optical system.

In the conventional projection exposure apparatus, the light amount distribution of the illuminating light is substantially uniform, on a plane corresponding to the Fourier transformation of the reticle pattern or on a plane in the vicinity thereof (namely on the pupil plane of the illuminating optical system), in a substantially circular or rectangular area containing the optical axis of the illuminating optical system. Such illumination is called ordinary illumination. For transferring a finer pattern in the conventional projection exposure apparatus utilizing such ordinary illumination, it has been necessary to select either the light of a shorter wavelength or the projection optical system of a larger numerical aperture.

Also for this purpose there has been proposed the so-called phase shift reticle which displaces the phase, by $\pi$, of the light transmitted by a specified portion of the translucent area of the circuit pattern on the reticle, with respect to the light transmitted by another portion, as disclosed for example in the Japanese Patent Publication No. 62-50811.

Also there has been proposed a method of limiting the light amount distribution of the illuminating light on the pupil plane of the illuminating optical system to a specified shape not containing the optical axis of said illuminating optical system. Said method is designed to increase the resolving power or the depth of focus by limiting the light amount distribution on the pupil plane of the illuminating optical system to an annular shape (hereinafter called annular illumination) or to a specified eccentric shape with respect to the optical axis (hereinafter called modified light source). The modified light source was reported in the 1991 Fall Convention of Applied Physics, and is equivalent, in principle, to an inclined illumination to the reticle pattern.

In the field of memory devices, the major trend of the circuit pattern is to utilize formation of stacked capacitors formed on the wafer surface. The capacity of such stacked capacitors increases with the thickness (or height) thereof, enabling attainment of a higher level of integration. In such configuration, however, there is inevitably developed a large step (in the order of 0.8 to 1 μm) between a memory cell area in which such stacked capacitors are provided and the other peripheral circuit area. Because additional circuits have to be formed on such memory cell area and on the peripheral circuit area, there is required a very large depth of focus.

In the above-mentioned conventional technology, the reduction of the wavelength of the illuminating light is currently considered difficult, for example because of the absence of a suitable optical material usable for the transmissive optical elements. Also the increase of the numerical aperture of the projection optical system is quite difficult, and, even if it is made possible, there will result a drastic reduction of the depth of focus.

On the other hand, the phase shift reticle is still associated with various technical difficulties, such as its high cost arising out of the complex manufacturing process thereof, still unestablished methods of inspection and repairing, and limitations on the usable photoresist.

On the other hand, the modified light source does not increase the depth of focus for an isolated pattern or a periodical pattern in certain directions, thus hindering the higher level of integration in such memory devices utilizing the stacked capacitors.

SUMMARY OF THE INVENTION

An object of the present invention is to provide a projection exposure method for satisfactorily projecting and focusing plural patterns, on a same original plate, onto the positions of different heights on the photosensitive substrate at the same time.

Another object of the present invention is to provide a method of projecting a first pattern on the original onto a first height position on the photosensitive substrate and projecting a second pattern on the original onto a second height position on said photosensitive substrate, wherein the image of said first pattern is so projected as to have a larger depth of focus than that of the image of said second pattern, and said second height position of the photosensitive substrate is precisely aligned with the best focal plane of the projection optical system, thereby satisfactorily projecting said first and second images.

Still another object of the present invention is to provide a projection exposure method, utilizing a fact that the depth of focus can be increased at the projection of a periodic pattern, for forming the image of a periodic pattern at a first height position of a photosensitive substrate and forming the image of a non-periodic pattern at a second height position of the photosensitive substrate.

Still another object of the present invention is to provide a projection exposure apparatus according to such methods.

The present invention is based on a fact that the illumination by the light from a modified light source increases the depth of focus of a periodic pattern but does not increase the depth of focus of a non-periodic pattern.

The present invention enables the manufacture of a memory device of stacked capacitor type of a high level of integration, having a memory cell area consisting of periodic patterns and a peripheral circuit area consisting of non-periodic patterns.

In a preferred embodiment of the present invention, there is provided a focus detection system for measuring the height position in plural points on the photosensitive substrate, and the focusing is conducted according to a specified signal selected, according to the data indicating the arrangement of devices on the substrate, from plural signals released from said focus detection system.

DETAILED DESCRIPTION OF THE PREFERRED EMBODIMENTS

Figure 1:
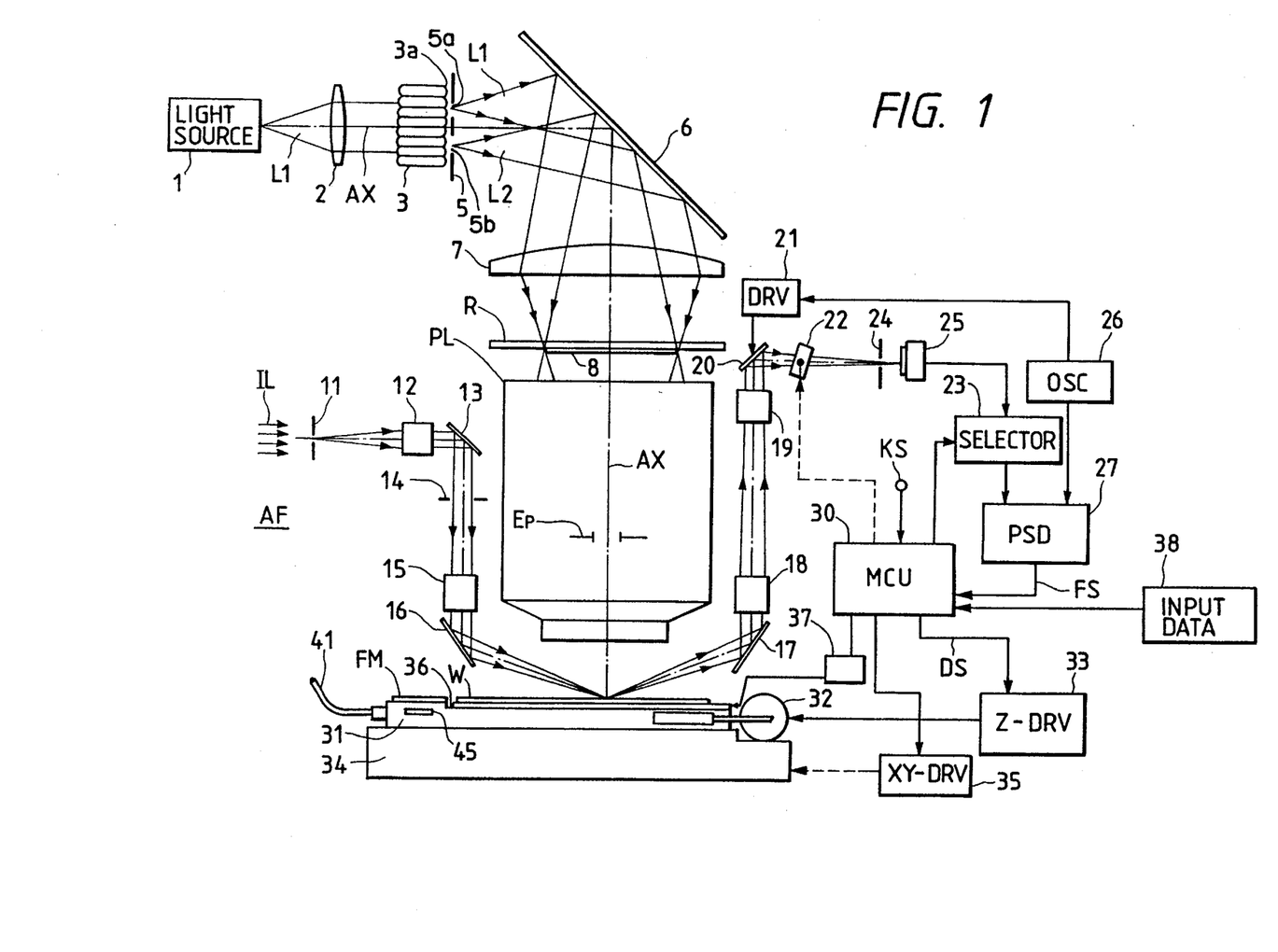
FIG. 1 is a view showing schematic configuration of an embodiment of the projection exposure apparatus of the present invention.

FIG. 1 shows an embodiment of the projection exposure apparatus provided with a focus detection system.

Figure 2:
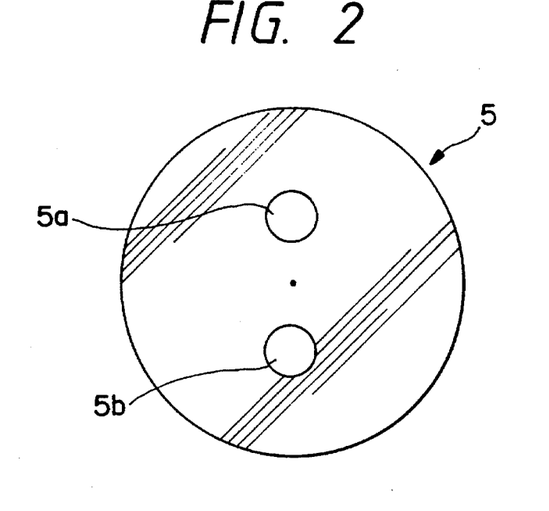
FIG. 2 is a plan view of a light shield member.

Light emitted from a light source 1 such as a mercury lamp or an excimer laser is guided through a relay lens 2 and enters a fly's eye lens 3, which is so positioned that the focal plane 3a thereof at the reticle side substantially coincides with the optical Fourier transformation plane of a reticle pattern 8 (hereinafter called pupil plane of the illumination optical system). In the vicinity of said focal plane 3a, there is provided a light shield member 5 provided, as shown in FIG. 2, with two apertures 5a, 5b, which are deviated from the optical axis AX of the illuminating optical system and limit the light amount distribution, on the pupil plane of the illuminating optical system, to two partial areas not including the optical axis AX of the illuminating optical system. Light beams L1, L2 emerging from said apertures 5a, 5b are guided by a mirror 6 and a condenser lens 7, and illuminate a reticle R with a substantially uniform illumination intensity.

As the illumination intensity in an area including the optical axis AX on the focal plane 3a is reduced to zero by the light shield member 5, the illuminating light entering the reticle pattern 8 is limited to plural light beams respectively having certain incident angles to the reticle face, and the magnitude of said incident angle corresponds to the distance of the apertures 5a, 5b from the optical axis AX. The position of the apertures 5a, 5b on the light shield member 5 is so determined as to match a specified periodic pattern contained in the reticle pattern 8, and the incident angle of the illuminating light to the reticle pattern 8 can be controlled by regulating the position of the apertures 5a, 5b.

Figure 3:
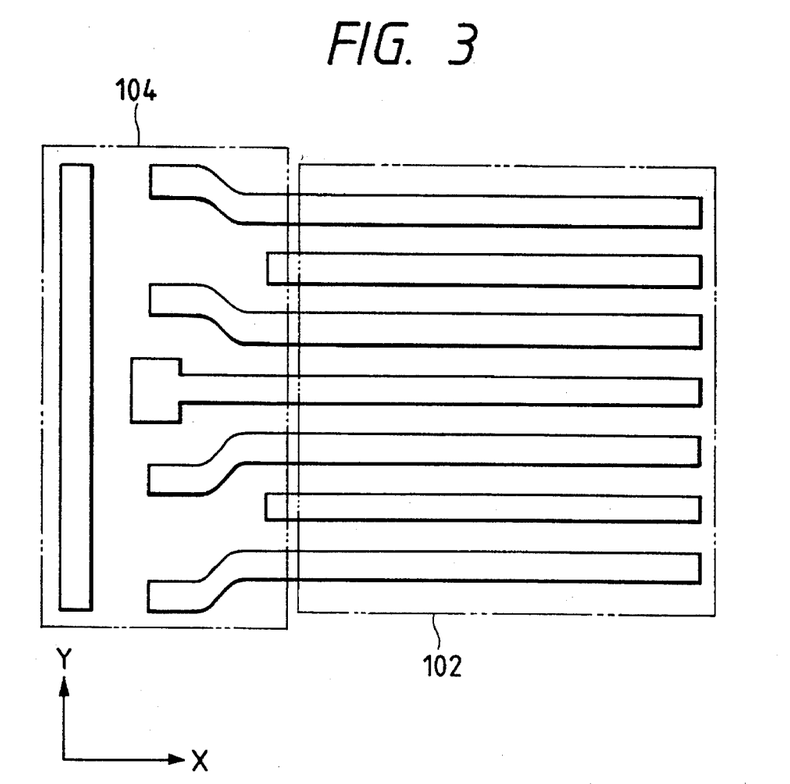
FIG. 3 is a plan view of an example of a periodic wiring pattern provided on a reticle.

FIG. 3 shows a wiring pattern, as an example of the periodic pattern. Said pattern is an electrode pattern to be formed on a stacked memory capacitor, and is composed of a memory cell area 102 and a peripheral circuit area 104. The memory cell area 102 is composed of a pattern periodically arranged in one direction (Y-direction), while the peripheral circuit area 104 is composed of isolated or diagonal patterns.

As described in detail in the U.S. patent application Ser. No. 791,138 filed on Nov. 13, 1991 by the present applicant, when the illuminating light by a modified light source enters the reticle pattern 8 with a specified angle, either one of the ±1st-order diffracted lights, diffracted by the periodic pattern of the memory cell area 102 and the 0-th order diffracted light are transmitted by the pupil plane Ep of the projection optical system PL, thereby increasing the apparent numerical aperture and improving the resolution. Also the depth of focus increases if the position said ±1st or −1st order diffracted light and that of the 0-th order diffracted light are equally distanced from the optical axis AX on the pupil plane Ep. The depth of focus can be increased significantly when a relationship $\sin \phi = \lambda/2P$ stands, wherein $\lambda$ is the wavelength of the illuminating light, P is the pitch of the periodic pattern and $\phi$ is the incident angle of the illuminating light.

The light beam or beams illuminating the reticle R are inclined to the optical axis AX of the projection optical system, and, if the direction of center of gravity of the light amount distribution of said light beam or beams is inclined with respect to the optical axis AX, the position of the transferred image is shifted along the wafer plane in case of a slight defocus of the wafer. This drawback can be prevented by maintaining the direction of center of gravity of the light amount distribution of the illuminating light beams on the wafer, perpendicular to the reticle pattern 8, or parallel to the optical axis AX. This can be achieved, for example, on the pupil plane of the illuminating system, by bringing the vector sum of the products of the position vectors of the apertures 5a, 5b with respect to the optical axis AX and the illuminating light amounts to substantially zero. A specific example of such illuminating light amount distribution is attained by employing 2 m light beams (m being a natural number), placing m beams in arbitrary manner and placing the remaining m beams symmetrically with the first-mentioned beams with respect to the optical axis AX.

In the present embodiment, there are provided plural light shield members which are mutually different in the number and the position of the apertures. An optimum light shield member is selected according to the cyclic length of the periodic pattern and is positioned at the pupil plane. The diameter per aperture of the light shield member is preferably so selected that the ratio of the numerical aperture of the illuminating light beam passing through said aperture to the reticle R and the numerical aperture of the projection optical system PL at the reticle side, or so-called $\sigma$ value, is within a range of about 0.1 to 0.3. A $\sigma$ value smaller than 0.1 deteriorates the pattern fidelity of the transferred image, while a $\sigma$ value larger than 0.3 attenuates the effects of increases in resolution and in depth of focus.

On the other hand, in the peripheral circuit area 104, the modified light source does not provide the effect of increase of the depth of focus, in comparison with the ordinary illumination, because the peripheral circuit area 104 contains the non-periodic (isolated) patterns in a larger amount.

The diffracted lights generated by the thus illuminated reticle pattern 8 are concentrated on the wafer W by the projection optical system PL which is telecentric both on the object side and on the image side, whereby the image of the reticle pattern 8 is transferred onto the photosensitive face of the wafer W. The information relating to the specific periodic pattern is entered by information input means 38, such as an operation console or a bar code reader.

In the present embodiment the modified light source is realized by the light shield member, but there can be considered various modifications. For example, it is also possible to employ at least one of a diffraction grating pattern, a prism, a mirror and optical fibers for dividing the light beam entering the fly's eye lens 3 into two and thereby limiting the light amount distribution on the pupil plane of the illuminating optical system to two partial areas not including the optical axis AX. It is also possible to place a diffraction grating pattern of phase grating type at a small distance from the reticle pattern 8 at the light source side, thereby converting the illuminating light into beams of specified incident angles.

In the following there will be explained the auto focusing (AF) system in the oblique incident light system of the present embodiment. The AF system shown in FIG. 1 is provided, in plural positions in the projection field of the projection lens PL, with points for measuring the positional error of the wafer in the axial direction (so-called defocus). An illuminating light IL, non-actinic to the wafer, is supplied from an unrepresented light source, and illuminates a slit plate 11 with a slit extending perpendicularly to the plane of the drawing. The light transmitted by said slit obliquely illuminates the wafer W, by way of a lens system 12, a mirror 13, a diaphragm 14, an objective lens 15 and a mirror 16. The lens system 12 and the objective lens 15 are so adjusted that the image of the slit is focused on the wafer surface when it coincides with the best focal plane Fo of the projection optical system. Also the optical axis of the objective lens 15 is at an angle of 5°–12° to the wafer surface, and the center of the slit image is placed at the crossing point of the optical axis AX with the wafer.

The light beam coming from the slit and reflected by the wafer W is guided by a mirror 17, an objective lens 18, a lens system 19, a vibrating mirror 20 and a transparent parallel-faced flat plate 22 and is re-focused on a light-receiving slit plate 24, which has a slit extending perpendicularly to the plane of the drawing. The vibrating mirror 20 vibrates about an axis perpendicular to the plane of drawing, thereby causing a small vibration on the slit image on said light-receiving slit plate 24, in a direction perpendicular to the longitudinal direction of said slit image. The parallel-faced flat plate 22 is provided for shifting the center of vibration of the slit image, relative to the slit of the slit plate 24, in a direction perpendicular to the longitudinal direction of the slit. The vibrating mirror 20 is vibrated by a driving device 21 controlled by a drive signal from an oscillator 26.

The light beam transmitted by the slit of the slit plate 24 is received by an array sensor 25, which includes plural photoelectric cells, consisting of silicon photodidoes or phototransistors, arranged parallel to the longitudinal direction of the slit of the slit plate 24. Signals from said cells of the array sensor 25 are selected or grouped by a selector circuit 23 and supplied to a phase-synchronized detector (PSD) 27, which receives an AC signal of the same phase as that of the drive signal from the oscillator 26 and effects synchronized detection based on the phase of said AC signal.

The PSD 27 is provided with plural detecting circuits and effects synchronized detections individually on the output signals of plural photoelectric cells selected from the array sensor 25. The obtained output signal FS is supplied to a main control unit (MCU) 30. Said output signal FS is called S-curve signal, which assumes a zero level when the center of the slit of the slit plate 24 coincides with the center of vibration of the slit image, but assumes a positive or negative level respectively when the wafer is displaced upwards or downwards. Thus, the MCU 30 detects, as the focused position, the height position of the wafer when said output signal FS reaches the zero level.

In such AF system with oblique incident light, the height position of the wafer at the focused point does not necessarily coincide with the best focal plane Fo. More specifically, the AF system with the oblique incident light has an imaginary reference plane determined by the system itself, and the output signal FS of the PSD assumes the zero level when the wafer surface coincides with said reference plane.

The reference plane is maintained as close as possible to the best focal plane Fo at the manufacture of the apparatus, but there is no guarantee that said planes mutually coincide over a long period. For this reason, the inclination of the parallel-faced flat plate 22 is adjusted in order to define the positional relationship between the reference plane and the best focal plane Fo.

On a Z-stage 31 there is provided a fiducial mark FM for determining the best focal plane Fo. Said mark FM is composed of plural slit-shaped apertures, which are illuminated from under by the light of a wavelength substantially same as that of the exposing light, supplied by optical fibers 41. The surface of said mark FM substantially coincides, in height, with the wafer surface. Consequently, by moving said mark FM to a position below the projection lens PL and illuminating said mark FM with the light from the optical fibers 41, the light transmitted by the apertures of the mark FM is transmitted by the projection lens PL, then reflected by the reticle R, returns to the projection lens and enters a photosensor 45 provided under said apertures. The position of the best focal plane Fo can be determined when the light intensity received by said photosensor 45 reaches maximum by vertical movement of the Z-stage 31.

The MCU 30 performs the functions of calibrating the AF system by receiving the output signal KS from the photosensor 45; setting the inclination of the parallel-faced flat plate 22; sending an instruction signal DS to a driving circuit 33 based on the output signal FS of the AF system, thereby controlling a driving motor 32 for the Z-stage 31; and controlling an XY-stage 34 by sending an instruction to the driving unit 35. The MCU 30 also has a function of sending an instruction to a levelling drive unit 37 based on the output signal FS of the multi-point AF system, thereby controlling a levelling stage 36 provided on the Z-stage 31.

Figure 5:
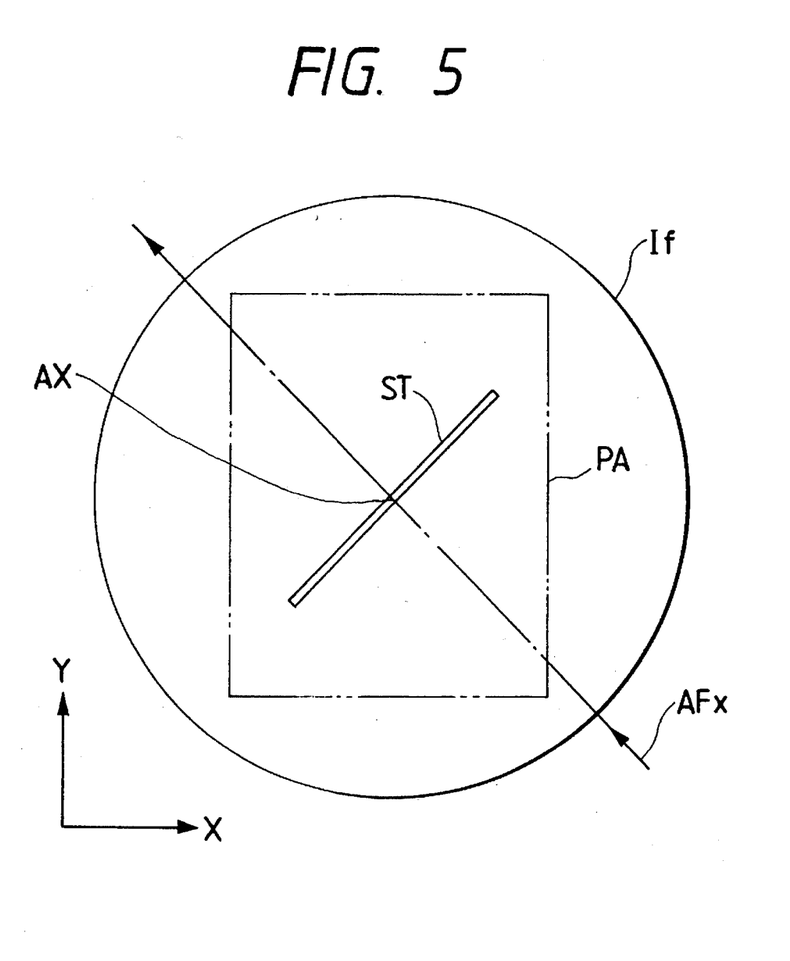
FIG. 5 is a plan view of the light-receiving face of an array sensor.

FIG. 5 shows the positional relationship between the projection field If of the projection lens PL on the wafer surface and the slit image ST of the AF system. The projection field If is generally circular, and the pattern area PA of the reticle is a rectangle contained in said circle. The slit image formed on the wafer is inclined by 45° to the moving coordinates XY of the XY-stage 34. Consequently, the common axis AFx of the objective lenses 15, 18 is perpendicular to the slit image ST on the wafer surface. Also, the center of slit image ST on the wafer positioned as to substantially coincide with the optical axis AX of the projection lens. The slit image ST is so selected as to extend as long as possible within the projection area of the pattern area PA.

Figure 6:
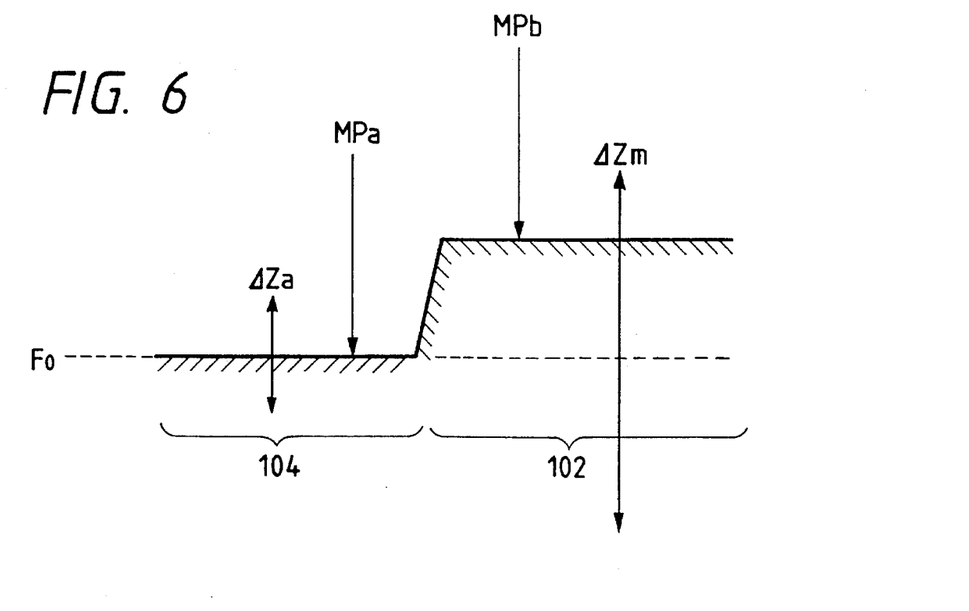
FIG. 6 is a magnified cross-sectional view of a stepped portion between a periodic pattern on the wafer and a peripheral circuit pattern area.

In general, the wafer surface on which the pattern area PA is projected already carries a shot area to be superposed with said pattern area. In particular, in the step of projecting the wiring pattern shown in FIG. 3, the shot area of the wafer contains a large step difference in height. Said step difference becomes larger with the progress of device manufacturing process. Also, in case of placing plural chips within a shot area, there is formed a scribe line extending in the X- or Y-direction in said shot area, for separating chips as shown in FIG. 6, and the step difference between the scribe line and the stacked capacitor area may exceed 2 μm.

Figure 4:
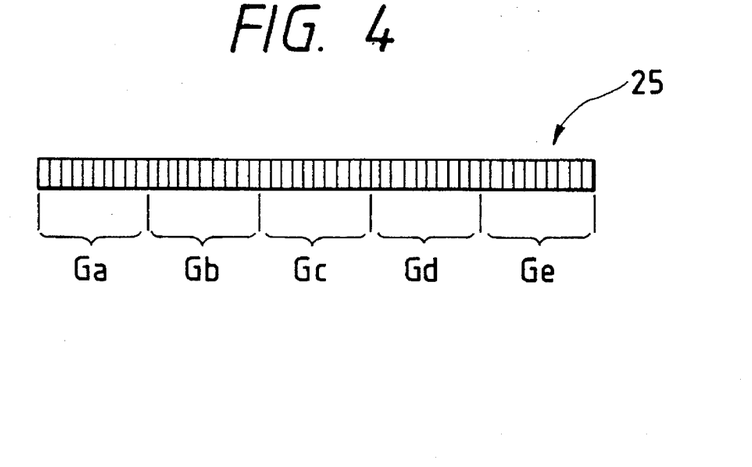
FIG. 4 is a plan view showing the relationship between the field of the projection lens and the slit image formed by the focus detection system.

In the following there will be explained a specific example of signal processing in the array sensor 25, the selector 23, the PSD 27 and the MCU 30. The selector 23 divides, as shown in FIG. 4, the photoelectric cells of the array sensor 25 into five groups Ga, Gb, Gc, Gd, Ge and effects selection or combination of the cells within each group. The central group Gc corresponds to the central part of the slit image ST, while the groups Ga, Ge correspond to the end portions of said slit image ST, and the groups Gb, Gd correspond to the portions between the group Gc and the groups Ga, Ge.

As the step difference information indicating the correspondence between the portions of the slit image ST and the memory cell area 102 or the peripheral circuit area 104 can be known in advance from the design data, it is also possible to know in advance the correspondence between the groups of the array sensor 25 and the memory cell area 102 or the peripheral circuit area 104. The grouping of the sensor is achieved by designating the points of connection of the selector, based upon said step difference information, which is entered by the input means 38.

The selector 23 has a function arbitrarily selecting one of plural photoelectric cells in a group and sending its output signal to the PSD 27, and a function of arbitrarily selecting the adjacent two or three photoelectric cells in a group and sending a signal, corresponding to the sum of their output signals, to the PSD 27.

There are provided 5 sets of the selector 23 and the PSD 27, respectively corresponding to the five groups. The five PSD's 27 respectively receive basic AC signals from the oscillator 26 and generate detection output signals FS, which are respectively converted into digital values by an analog-digital converter (ADC) in the MCU 30, thereby providing five measured values (five focus detection signals) indicating the deviations between the measured plane and the best focal plane Fo. This difference is supplied as the instruction signal DS to the driving circuit 33.

The MCU 30 selects one of said five focus detection signals according to the following method.

FIG. 6 is a magnified cross-sectional view of a wafer having a memory pattern of the stacked capacitor type. The memory cell area 102 has a stacked structure for elevating the level of integration, thus generating a large step difference from the peripheral circuit area 104.

The step difference information, containing the positional information representing the arrangement of the memory cell area and the peripheral circuit area 104, and the periodicity information representing the periodic structure of the memory cell area 102, is entered from the input means 38. A light shield member 5 provided with positionally optimum apertures 5a, 5b is selected, based on the periodicity of the periodic pattern.

The MCU 30 selects a measuring point on the peripheral circuit area 104, based on the positional information. More specifically, as shown in FIG. 6, the MCU 30 selects the focus detection signal corresponding to a measuring point MPa on the peripheral circuit area 104 and matches the surface of said measuring point MPa with the best focal plane Fo.

Even when a modified light source optimized to the periodic pattern is used, the depth of focus $\Delta Za$ for the peripheral circuit area 104 is comparable to that in case of ordinary illumination, but the reticle pattern can be satisfactorily transferred because the peripheral circuit area coincides with the best focal plane by the above-explained selection of the focus position. On the other hand, for the memory cell area 102, the depth of focus increases to $\Delta Zm$ by the use of a modified light source optimized for the periodic pattern. For this reason, the reticle pattern can be satisfactorily transferred even though the memory cell area 102 is distanced from the best focal plane.

According to the above-mentioned selection, the MCU 30 turns off other focus detection signals in order to process only the focus detection signal corresponding to the measuring point MPa, and the Z-stage 31 is so driven that the measured value corresponding to the point MPa reaches zero or a predetermined value. Also, the focus detection signal from the point MPa may be processed by averaging, with a weighting coefficient 1 for the measuring point MPa and a weighting coefficient 0 for other points. It is also possible to match the best focal plane Fo with the farthest measured plane from the projection optical system PL, based on the five focus detection signals. For example, if all tone focus detection signals are positive, the Z-stage 31 is so driven that the signal of smallest level reaches zero or the predetermined value. If said signals are all negative, the Z-stage 31 is so driven that the signal of largest level reaches zero or the predetermined value. If positive and negative signals are mixed, the Z-stage 31 is so driven that the negative signal of largest level reaches zero or the predetermined value.

In this manner, the peripheral circuit area other than the memory cells can be automatically brought to the best focus state, by selecting a focus detection signal indicating the lowest position on the wafer (namely the farthest position from the projection lens). Such method provides the advantage of excluding the error of the operator or avoiding the cost increase resulting from the presence of the operator.

Still another method consists of entering, in advance, an offset value corresponding to the step difference between the memory cell area and the peripheral circuit area from the input means 38, thereby offsetting the focus detection signal from the measuring point MPb corresponding to the memory cell area and thus matching the best focal plane with the peripheral circuit area 104. This method is effective in case the measuring point for detecting the peripheral circuit area is positioned on the edge of the step difference and is unable to provide a stable detection signal, or in case the detection signal fluctuates due to uneven coating of photoresist in the peripheral circuit area.

The offset value is entered by the operator. However, said offset value may be fixed, regardless of the kind of the LSI. The offset value need not be changed if the height of the stacked capacitor is constant, such as for the memories of different word configurations (such as x1, x4, x8, etc.; for example, x4 indicates that four signals can be read at a time), or for the different layouts of the cell area and the peripheral circuit area for dual port access for video use or for different packages.

The above-mentioned method of obtaining the focus detection signal from the memory cell area by adding the offset value is effective also in case the focus detection signal cannot be obtained from the measuring point MPa, due to the overflow of the peripheral circuit area from the wafer in a shot area at the wafer edge.

It is furthermore possible to provide a levelling sensor for detecting the inclination of the wafer, and to drive the levelling stage 36 through the levelling drive unit 37, thereby matching the wafer surface with the best focal plane. This method will enable further improved transfer of the circuit pattern. The levelling correction may also be conducted by detecting the inclination of the wafer, based on the focus detection signals of the plural measuring points of the substantially same heights (for example, the signals from the memory cell area only).

Figure 7:
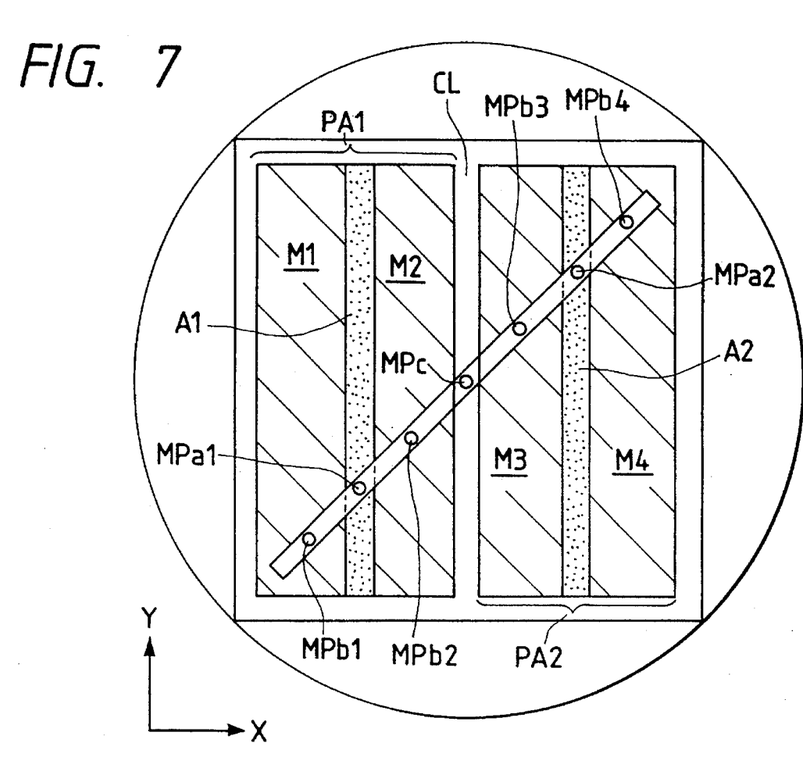
FIG. 7 is a plan view showing the positional relationship between a circuit pattern including plural chips and the slit image formed by the focus detection system.

In the following there will be explained, with reference to FIG. 7, a method for satisfactorily focusing to a shot area including plural chips.

Two chips PA1, PA2 are formed on both sides of a scribe line CL extending in the Y-direction in the shot area, for separating said chips. There are provided memory cell areas M1, M2, M3, M4 and peripheral circuit areas A1, A2. There are provided, measuring points MPb1, MPb2, MPb3, MPb4 for detecting the memory cell areas; MPa1, MPa2 for detecting the peripheral circuit areas; and MPc for detecting the scribe line CL.

In this example, the focus detection signal is obtained by averaging the signals from the two measuring points MPa1, MPa2 for detecting the peripheral circuit areas A1, A2. The peripheral circuit areas are matched with the best focus position by driving the Z-stage 31 in such a manner that said focus detection signal reaches zero or a predetermined value. It is also possible to obtain the focus detection signal by averaging the signals from the four measuring points MPb1–MPb4 for detecting the memory cell areas, and to drive the Z-stage 31 so as to match the peripheral circuit areas with the best focus position, by adding an offset value to said signal. It is further possible to match the peripheral circuit areas with the best focus position by adding an offset value to the signal from the measuring point for detecting the scribe line CL.

The above-mentioned method of matching the peripheral circuit areas with the best focus position is effective also in case of use of a phase shift reticle having phase shifter only for the memory cell areas having the step difference.

Though the foregoing embodiment employs the modified illumination, the annular illumination can also provide different depths of focus between the image of the memory cell area and that of the peripheral circuit area.

The foregoing embodiment effects the focus detection by means of a multi-point focus detecting system, but there may also be employed a focus detection system with only one measuring point. For example, after the peripheral circuit area is matched with the best focal plane by the measurement in the peripheral circuit area, the exposure can be conducted by the movement of the XY-stage 34 for effecting relative alignment of the reticle R and the wafer W.

Furthermore, the projection optical system can be a refractive system, a reflective system or a reflective-refractive system. The projection optical system in the foregoing embodiment is telecentric on both sides, but it can be telecentric on one side only, or non-telecentric on both sides.

Furthermore, the focus detection system can be based on an air micrometer or on an electrostatic capacitance.

What is claimed is:

1. A projection exposure method for projecting the image of a photomask bearing first and second patterns arranged according to mutually different modes of arrangement onto a photosensitive substrate by means of a projection optical system thereby exposing said photosensitive substrate to said image, comprising steps of:

illuminating said photomask so as to form, through said projection optical system, a projected image of a first depth of focus corresponding to said first pattern and a projected image of a second depth of focus corresponding to said second pattern, wherein said first depth of focus is larger than said second depth of focus; and matching a surface area, in which said second pattern is projected, of said photosensitive substrate with the best focal plane of said projection optical system.

2. A projection exposure method for projecting the image of a photomask including a first pattern of periodic character and a second pattern of non-periodic character onto a photosensitive substrate by means of a projection optical system thereby exposing said photosensitive substrate to said image, comprising steps of:

illuminating said photomask so as to form, through said projection optical system, a projected image of a first depth of focus corresponding to said first pattern and a projected image of a second depth of focus corresponding to said second pattern, wherein said first depth of focus is larger than said second depth of focus; and matching a surface area, in which said second pattern is projected, of said photosensitive substrate with the best focal plane of said projection optical system.

3. A projection exposure method for projecting the image of a photomask bearing first and second patterns arranged according to mutually different modes of arrangement onto a photosensitive substrate by means of a projection optical system thereby exposing said photosensitive substrate to said image, comprising steps of:

supplying a light beam for illuminating said photomask from an oblique direction;

forming, through said projection optical system, a projected image of a first depth of focus corresponding to said first pattern and a projected image of a second depth of focus corresponding to said second pattern, wherein said first depth of focus is larger than said second depth of focus; and matching a surface area, in which said second pattern is projected, of said photosensitive substrate with the best focal plane of said projection optical system.

4. A projection exposure method according to claim 3, wherein provided is a projection optical system having an optical axis substantially perpendicular to said photomask, and said light beam illuminates said photomask from a direction which is oblique, by a predetermined angle, to the optical axis of said illuminating optical system.

5. A projection exposure method according to claim 3, wherein provided are a light source and a projection optical system having an optical axis substantially perpendicular to said photomask, and a light beam entering said photomask obliquely with a predetermined angle to said optical axis is selected from the light emitted from said light source.

6. A projection exposure method for projecting the image of a photomask including a first pattern area in which a periodic pattern is formed and a second pattern area in which a periodic pattern is not formed, onto a photosensitive substrate by means of a projection optical system thereby exposing said photosensitive substrate to said image, comprising steps of:

supplying a light beam for illuminating said photomask from an oblique direction;

forming, through said projection optical system, a projected image of a first depth of focus corresponding to said first pattern area and a projected image of a second depth of focus corresponding to said second pattern area, wherein said first depth of focus is larger than said second depth of focus;

forming, in each of plural measuring points predetermined in the projection field of said projection optical system, positional information representing the positional aberration of the surface of said photosensitive substrate in the axial direction; and matching an area, in which said second pattern area is projected, of the surface of said photosensitive substrate with the best focal plane of said projection optical system, based on said positional information.

7. A projection exposure method according to claim 6, wherein provided are a light source and an illuminating optical system having an optical axis substantially perpendicular to said photomask, and the light from said light source is converted to an incident light beam which is oblique, by a predetermined angle, to said optical axis.

8. A projection exposure method according to claim 7, wherein said illuminating optical system has an optical Fourrier transformation plane for said photomask, and there is provided means for limiting the light beam passing an area including the optical axis of said illuminating optical system on said optical Fourrier transformation plane.

9. A projection exposure method according to claim 6, wherein there is selected at least one of the plural positional information at said plural measuring points, and said photosensitive substrate is moved in the axial direction of said projection optical system, based on said selected positional information.

10. A projection exposure method according to claim 9, wherein at least one of said plural measuring points is specified in advance, based on the design data relating to said photosensitive substrate.

11. A projection exposure method according to claim 9, wherein selected is the positional information from a measuring point measuring the surface of said photosensitive substrate, farthest from said projection optical system in the axial direction thereof.

12. A projection exposure method according to claim 6, further comprising steps of:

measuring the inclination of the surface of said photosensitive substrate, with respect to a plane substantially perpendicular to said optical axis, based on the positional information from said plural measuring points; and regulating the position of said photosensitive substrate according to said measurement.

13. A projection exposure apparatus, comprising:

a projection optical system provided between a mask and a photosensitive substrate, wherein said mask bears first and second patterns arranged according to mutually different modes of arrangement;

illumination means for illuminating said mask so as to form simultaneously a projected image of a first depth of focus corresponding to said first pattern and a projected image of a second depth of focus corresponding to said second pattern through said projection optical system, wherein said first depth of focus is larger than said second depth of focus; and means for matching a surface area, in which said second pattern is projected, of said photosensitive substrate with the best focal plane of said projection optical system.

14. A projection exposure apparatus, comprising:

a projection optical system provided between a mask and a photosensitive substrate, wherein said mask bears a first periodic pattern and a second non-periodic pattern;

illumination means for illuminating said mask so as to form simultaneously a projected image of a first depth of focus corresponding to said first pattern and a projected image of a second depth of focus corresponding to said second pattern through said projection optical system, wherein said first depth of focus is larger than said second depth of focus; and means for matching a surface area, in which said second pattern is projected, of said photosensitive substrate with the best focal plane of said projection optical system.

15. A projection exposure apparatus, comprising:

a projection optical system provided between a mask and a photosensitive substrate, wherein said mask bears first and second patterns arranged according to mutually different modes of arrangements;

illumination means for supplying a light beam for illuminating said mask from an oblique direction, thereby forming, simultaneously a projected image of a first depth of focus corresponding to said first pattern and a projected image of a second depth of focus corresponding to said second pattern through said projection optical system, wherein said first depth of focus is larger than said second depth of focus; and means for matching a surface area, in which said second pattern is projected, of said photosensitive substrate with the best focal plane of said projection optical system.

16. A projection exposure apparatus according to claim 15, wherein said illumination means includes an illuminating optical system having an optical axis substantially perpendicular to said mask, and said light beam enters said photomask obliquely by a predetermined angle to said optical axis.

17. A projection exposure apparatus according to claim 15, wherein said illumination means includes a light source, an illuminating optical system having an optical axis substantially perpendicular to said mask, and means for extracting said light beam, from the light coming from said light source, said light beam entering said mask obliquely with a predetermined angle to said optical axis.

18. A projection exposure apparatus comprising:

a projection optical system provided between a mask and a photosensitive substrate, wherein said mask includes a first pattern area in which a periodic pattern is formed and a second pattern area in which a periodic pattern is not formed;

illumination means for supplying a light beam for illuminating said mask from an oblique direction, thereby forming, simultaneously a projected image of a first depth of focus corresponding to said first pattern area and a projected image of a second depth of focus corresponding to said second pattern area through said projection optical system, wherein said first depth of focus is larger than said second depth of focus;

detection means having measuring points at plural predetermined positions in the projection field of said projection optical system and adapted to form positional information representing the positional aberration of the surface of said photosensitive substrate in the axial direction at each of said plural measuring points; and means for matching a surface area, in which said second pattern area is projected, of said photosensitive substrate with the best focal plane of said projection optical system, based on said positional information.

19. A projection exposure apparatus according to claim 18, wherein said illumination means includes a light source, an illuminating optical system having an optical axis substantially perpendicular to said mask, and means for converting the light from said light source into an incident light beam which is oblique to the optical axis of said illuminating optical system.

20. A projection exposure apparatus according to claim 19, wherein said illuminating optical system has an optical Fourier transformation plane for said mask, and said conversion means includes means for limiting the light beam passing an area including the optical axis of said illuminating optical system on said optical Fourier transformation plane.

21. A projection exposure apparatus according to claim 18, wherein said matching means includes selection means for selecting at least one of plural positional information at said plural measuring points, and means for moving said photosensitive substrate in the axial direction of said projection optical system, based on the positional information selected by said selection means.

22. A projection exposure apparatus according to claim 21, wherein said selection means includes means for specifying, in advance, at least one of said plural measuring points based on design data relating to said photosensitive substrate.

23. A projection exposure apparatus according to claim 21, wherein said selection means is adapted to select the positional information from a measuring point for measuring the surface of said photosensitive substrate farthest from said projection optical system in the axial direction thereof.

24. A projection exposure apparatus according to claim 18, further comprising:

means for measuring the inclination of the surface of said photosensitive substrate, with respect to a plane substantially perpendicular to said optical axis, based on the positional information from said plural measuring points; and means for regulating the position of said photosensitive substrate in response to said measuring means.

25. A projection exposure apparatus, comprising:

a projection optical system provided between a mask and a photosensitive substrate, wherein said mask bears first and second patterns arranged according to mutually different modes of arrangement;

an illumination optical system for illuminating said mask so as to form, simultaneously a projected image of a first depth of focus corresponding to said first pattern and a projected image of a second depth of focus corresponding to said second pattern through said projection optical system, wherein said first depth of focus is larger than said second depth of focus;

said illumination optical system including means for defining separate limited areas in a Fourier transformation plane with respect to said first and second patterns to have a comparatively high light intensity distribution apart from an optical axis of said illumination optical system; and means for matching a surface area, in which said second pattern is projected, of said photosensitive substrate with the best focal plane of said projection optical system.

26. A projection exposure apparatus according to claim 25, wherein said defining means includes a light shield member arranged at the Fourier transformation plane within said illumination optical system with respect to said first and second patterns or a position near thereto, said light shield member having at least a pair of apertures arranged at positions apart from said optical axis of said illumination optical system.

27. A projection exposure apparatus according to claim 26, wherein said light shield member includes two apertures arranged as a symmetrical pair with respect to the optical axis of said illumination optical system.

28. A projection exposure apparatus, comprising:

a projection optical system provided between a mask and a photosensitive substrate, wherein said mask bears a first periodic pattern and a second non-periodic pattern;

an illumination optical system for illuminating said mask so as to form, simultaneously a projected image of a first depth of focus corresponding to said first pattern and a projected image of a second depth of focus corresponding to said second pattern through said projection optical system, wherein said first depth of focus is larger than said second depth of focus;

said illumination optical system including spatial filter means for defining separate limited areas in a Fourier transformation plane with respect to said first and second patterns to have a comparatively high light intensity distribution apart from an optical axis of said illumination optical system; and means for matching a surface area, in which said second pattern is projected, of said photosensitive substrate with the best focal plane of said projection optical system.

29. A projection exposure apparatus according to claim 28, wherein said matching means includes means for inputting positional information of said first and second patterns, and means for determining a measuring point on the surface of said photosensitive substrate with which the best focal plane of said projection optical system is matched, based on the positional information from said input means.

30. A projection exposure apparatus according to claim 28, further comprising:

means for inputting periodicity information representing a periodic structure of said first pattern; and means for modifying said light intensity distribution defined by said spatial filter means, based on the periodicity information.

31. A projection exposure apparatus, comprising:

a projection optical system provided between a mask and a photosensitive substrate, wherein said mask includes a first pattern area in which a periodic pattern is formed and a second pattern area in which a periodic pattern is not formed;

an illumination optical system for illuminating said mask so as to form, simultaneously a projected image of a first depth of focus corresponding to said first pattern area and a projected image of a second depth of focus corresponding to said second pattern area through said projection optical system, wherein said first depth of focus is larger than said second depth of focus;

said illumination optical system including spatial filter means for defining separate limited areas in a Fourier transformation plane with respect to said first and second pattern areas to have a comparatively high light intensity distribution apart from an optical axis of said illumination optical system;

detection means having measuring points at plural predetermined positions in the projection field of said projection optical system and adapted to form positional information representing the positional aberration of the surface of said photosensitive substrate in the axial direction of said projection optical system at each of said plural measuring points; and means for matching a surface area, in which said second pattern area is projected, of said photosensitive substrate with the best focal plane of said projection optical system, based on said positional information.

32. A projection exposure apparatus according to claim 31, wherein said matching means includes means for selecting positional information for at least one of said plural measuring points, and means for moving said photosensitive substrate in the axial direction of said projection optical system, based on the positional information selected by said selection means.

33. A projection exposure apparatus according to claim 32, wherein said selection means includes means for specifying, in advance, at least one of said plural measuring points based on design data relating to said photosensitive substrate.

34. A projection exposure apparatus according to claim 32, wherein said selection means is adapted to select the positional information from a measuring point for measuring the surface of said photosensitive substrate farthest from said projection optical system in the axial direction thereof.

35. A projection exposure apparatus according to claim 31, further comprising:

means for measuring the inclination of the surface of said photosensitive substrate with respect to a plane substantially perpendicular to said optical axis, based on the positional information from said plural measuring points; and means for regulating the position of said photosensitive substrate in response to said measuring means.

36. A projection exposure apparatus, comprising:

a projection optical system provided between a mask and a photosensitive substrate, wherein said mask bears first and second patterns arranged according to mutually different modes of arrangement;

illumination means for illuminating said mask so as to form, simultaneously, a projected image of a first depth of focus corresponding to said first pattern and a projected image of a second depth of focus corresponding to said second pattern through said projection optical system, wherein said first depth of focus is larger than said second depth of focus; and means for determining a best focus state with respect to both of said first pattern and said second pattern, said best focus state being a condition wherein a surface area of said photosensitive substrate in which the image corresponding to said second pattern is projected is matched with the best focal plane of said projection optical system.

37. A projection exposure apparatus, comprising:

a projection optical system provided between a mask and a photosensitive substrate, wherein said mask bears a first periodic pattern and a second non-periodic pattern;

illumination means for illuminating said mask so as to form, simultaneously, a projected image of a first depth of focus corresponding to said first pattern and a projected image of a second depth of focus corresponding to said second pattern through said projection optical system, wherein said first depth of focus is larger than said second depth of focus; and means for determining a best focus state with respect to both of said first pattern and said second pattern, said best focus state being a condition wherein a surface area of said photosensitive substrate in which the image corresponding to said second pattern is projected is matched with the best focal plane of said projection optical system.

38. A projection exposure apparatus, comprising:

a projection optical system provided between a mask and a photosensitive substrate, wherein said mask bears first and second patterns arranged according to mutually different modes of arrangement;

illumination means for supplying a light beam for illuminating said mask from an oblique direction, thereby forming, simultaneously, a projected image of a first depth of focus corresponding to said first pattern and a projected image of a second depth of focus corresponding to said second pattern through said projection optical system, wherein said first depth of focus is larger than said second depth of focus; and means for determining a best focus state with respect to both of said first pattern and said second pattern, said best focus state being a condition wherein a surface area of said photosensitive substrate in which the image corresponding to said second pattern is projected is matched with the best focal plane of said projection optical system.

39. A projection exposure apparatus according to claim 38, wherein said illumination means includes an illuminating optical system having an optical axis substantially perpendicular to said mask, and said light beam enters said mask obliquely by a predetermined angle to said optical axis.

40. A projection exposure apparatus according to claim 38, wherein said illumination means includes a light source, an illuminating optical system having an optical axis substantially perpendicular to said mask, and means for extracting said light beam from the light coming from said light source, said light beam entering said mask obliquely with a predetermined angle to said optical axis.

41. A projection exposure apparatus comprising:

a projection optical system provided between a mask and a photosensitive substrate, wherein said mask includes a first pattern area in which a periodic pattern is formed and a second pattern area in which a periodic pattern is not formed;

illumination means for supplying a light beam for illuminating said mask from an oblique direction, thereby forming, simultaneously, a projected image of a first depth of focus corresponding to said first pattern area and a projected image of a second depth of focus corresponding to said second pattern area through said projection optical system, wherein said first depth of focus is larger than said second depth of focus;

detection means having measuring points at plural predetermined positions in the projection field of said projection optical system and adapted to form positional information representing the positional aberration of the surface of said photosensitive substrate in the axial direction at each of said plural measuring points; and means for determining a best focus state with respect to both of said first pattern area and said second pattern area based on said positional information, said best focus state being a condition wherein a surface area of said photosensitive substrate in which the image corresponding to said second pattern area is projected is matched with the best focal plane of said projection optical system.

42. A projection exposure apparatus according to claim 41, wherein said illumination means includes a light source, an illuminating optical system having an optical axis substantially perpendicular to said mask, and means for converting the light from said light source into an incident light beam which is oblique to the optical axis of said illuminating optical system.

43. A projection exposure apparatus according to claim 42, wherein said illuminating optical system has an optical Fourier transformation plane for said mask, and said conversion means includes means for limiting the light beam passing an area including the optical axis of said illuminating optical system on said optical Fourier transformation plane.

44. A projection exposure apparatus according to claim 41, wherein said determining means includes selection means for selecting at least one of plural positional information at said plural measuring points, said apparatus further comprising means for moving said photosensitive substrate in the axial direction of said projection optical system, based on the positional information selected by said selection means.

48. A projection exposure apparatus according to claim 44, wherein said selection means includes means for specifying, in advance, at least one of said plural measuring points based on design data relating to said photosensitive substrate.

46. A projection exposure apparatus according to claim 44, wherein said selection means is adapted to select the positional information from a measuring point for measuring the surface of said photosensitive substrate farthest from said projection optical system in the axial direction thereof.

47. A projection exposure apparatus according to claim 41, further comprising:

means for measuring the inclination of the surface of said photosensitive substrate, with respect to a plane substantially perpendicular to said optical axis, based on the positional information from said plural measuring points; and means for regulating the position of said photosensitive substrate in response to said measuring means.

48. A projection exposure apparatus, comprising:

a projection optical system provided between a mask and a photosensitive substrate, wherein said mask bears first and second patterns arranged according to mutually different modes of arrangement;

an illumination optical system for illuminating said mask so as to form, simultaneously, a projected image of a first depth of focus corresponding to said first pattern and a projected image of a second depth of focus corresponding to said second pattern through said projection optical system, wherein said first depth of focus is larger than said second depth of focus;

said illumination optical system including means for defining separate limited areas in a Fourier transformation plane with respect to said first and second patterns to have a comparatively high light intensity distribution apart from an optical axis of said illumination optical system; and means for determining a best focus state with respect to both of said first pattern and said second pattern, said best focus state being a condition wherein a surface area of said photosensitive substrate in which the image corresponding to said second pattern is projected is matched with the best focal plane of said projection optical system.

49. A projection exposure apparatus according to claim 48, wherein said defining means includes a light shield member arranged at the Fourier transformation plane within said illumination optical system with respect to said first and second patterns or a position near thereto, said light shield member having at least a pair of apertures arranged at positions apart from said optical axis of said illumination optical system.

50. A projection exposure apparatus according to claim 49, wherein said light shield member includes two apertures arranged as a symmetrical pair with respect to the optical axis of said illumination optical system.

51. A projection exposure apparatus, comprising:

a projection optical system provided between a mask and a photosensitive substrate, wherein said mask bears a first periodic pattern and a second non-periodic pattern;

an illumination optical system for illuminating said mask so as to form, simultaneously, a projected image of a first depth of focus corresponding to said first pattern and a projected image of a second depth of focus corresponding to said second pattern through said projection optical system, wherein said first depth of focus is larger than said second depth of focus;

said illumination optical system including spatial filter means for defining separate limited areas in a Fourier transformation plane with respect to said first and second patterns to have a comparatively high light intensity distribution apart from an optical axis of said illumination optical system; and means for determining a best focus state with respect to both of said first pattern and said second pattern, said best focus state being a condition wherein a surface area of said photosensitive substrate in which the image corresponding to said second pattern is projected is matched with the best focal plane of said projection optical system.

52. A projection exposure apparatus according to claim 51, wherein said determining means includes means for inputting positional information of said first and second patterns, and means for determining a measuring point on the surface of said photosensitive substrate with which the best focal plane of said projection optical system is matched, based on the positional information from said input means.

53. A projection exposure apparatus according to claim 51, further comprising:

means for inputting periodicity information representing a periodic structure of said first pattern; and means for modifying said light intensity distribution defined by said spatial filter means, based on the periodicity information.

54. A projection exposure apparatus, comprising:

a projection optical system provided between a mask and a photosensitive substrate, wherein said mask includes a first pattern area in which a periodic pattern is formed and a second pattern area in which a periodic pattern is not formed;

an illumination optical system for illuminating said mask so as to form, simultaneously, a projected image of a first depth of focus corresponding to said first pattern area and a projected image of a second depth of focus corresponding to said second pattern area through said projection optical system, wherein said first depth of focus is larger than said second depth of focus;

said illumination optical system including spatial filter means for defining separate limited areas in a Fourier transformation plane with respect to said first and second pattern areas to have a comparatively high light intensity distribution apart from an optical axis of said illumination optical system;

detection means having measuring points at plural predetermined positions in the projection field of said projection optical system and adapted to form positional information representing the positional aberration of the surface of said photosensitive substrate in the axial direction of said projection optical system at each of said plural measuring points; and means for determining a best focus state with respect to both of said first pattern area and said second pattern area based on said positional information, said best focus state being a condition wherein a surface area of said photosensitive substrate in which the image corresponding to said second pattern area is projected is matched with the best focal plane of said projection optical system.

55. A projection exposure apparatus according to claim 54, wherein said determining means includes selection means for selecting at least one of plural positional information at said plural measuring points, said apparatus further comprising means for moving said photosensitive substrate in the axial direction of said projection optical system, based on the positional information selected by said selection means.

56. A projection exposure apparatus according to claim 54, wherein said selection means includes means for specifying, in advance, at least one of said plural measuring points based on design data relating to said photosensitive substrate.

57. A projection exposure apparatus according to claim 56, wherein said selection means is adapted to select the positional information from a measuring point for measuring the surface of said photosensitive substrate farthest from said projection optical system in the axial direction thereof.

58. A projection exposure apparatus according to claim 56, further comprising:

- means for measuring the inclination of the surface of said photosensitive substrate with respect to a plane substantially perpendicular to said optical axis, based on the positional information from said plural measuring points; and
- means for regulating the position of said photosensitive substrate in response to said measuring means.

* * * * *

UNITED STATES PATENT AND TRADEMARK OFFICE
CERTIFICATE OF CORRECTION

PATENT NO. : 5,481,332
DATED : January 2, 1996
INVENTOR(S) : Naomasa Shiraishi

It is certified that error appears in the above-indentified patent and that said Letters Patent is hereby corrected as shown below:

On cover page,

The Related U.S. Application Data should read as follows:

-- [63] Continuation of Ser. No. 208,041, Mar. 9, 1994, abandoned, which is a continuation of Ser. No. 24,300, Mar. 1, 1993, abandoned.--

Signed and Sealed this

Twenty-third Day of April, 1996

Attest:

BRUCE LEHMAN

Attesting Officer

Commissioner of Patents and Trademarks